(12) United States Patent
Kim et al.

(10) Patent No.: US 10,579,174 B2
(45) Date of Patent: Mar. 3, 2020

(54) TOUCH SENSOR INCLUDING TOUCH SENSING ELECTRODES AND DISPLAY DEVICE HAVING THE SAME

(71) Applicant: Samsung Display Co., Ltd., Yongin-si (KR)

(72) Inventors: Kwan Ho Kim, Yongin-si (KR); Jin Hee Park, Yongin-si (KR); Ho Seok Son, Yongin-si (KR); Sung Yeon Cho, Yongin-si (KR); Jae Hyung Cho, Yongin-si (KR); Hyun Jae Na, Yongin-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 19 days.

(21) Appl. No.: 15/794,829

(22) Filed: Oct. 26, 2017

(65) Prior Publication Data
US 2018/0143720 A1     May 24, 2018

(30) Foreign Application Priority Data
Nov. 18, 2016     (KR) .......................... 10-2016-0153979

(51) Int. Cl.
*G06F 3/041*     (2006.01)
*G06F 3/044*     (2006.01)
(Continued)

(52) U.S. Cl.
CPC ............ *G06F 3/0412* (2013.01); *G06F 3/044* (2013.01); *G09G 3/3225* (2013.01); *H01L 51/5253* (2013.01); *G06F 2203/04102* (2013.01); *G06F 2203/04111* (2013.01); *G06F 2203/04112* (2013.01); *H01L 27/323* (2013.01);
(Continued)

(58) Field of Classification Search
CPC . G06F 2203/04102; G06F 2203/04111; G06F 2203/04112
See application file for complete search history.

(56) References Cited

U.S. PATENT DOCUMENTS 9,383,849 B2     7/2016  Hur
9,459,751 B2 *  10/2016  Weaver .................. G06F 3/041
(Continued)

FOREIGN PATENT DOCUMENTS

JP       2016-81529          5/2016
KR    10-2014-0096507        8/2014
(Continued)

*Primary Examiner* — Chun-Nan Lin
(74) *Attorney, Agent, or Firm* — H.C. Park & Associates, PLC

(57) ABSTRACT

A touch sensor includes a touch sensing column, a touch sensing row, and connectors. The touch sensing column has a plurality of first touch sensing electrodes extending in one direction. The touch sensing row has a plurality of second sensing electrodes extending in a direction intersecting the touch sensing column. The connectors connect adjacent first touch sensing electrodes or adjacent second touch sensing electrodes. Here, at least some of the first touch sensing electrodes or the second touch sensing electrodes include a first region connected to the connectors and having a first line resistance, and a second region adjacent the first region and having a second line resistance. The first line resistance is different from the second line resistance.

15 Claims, 8 Drawing Sheets

(51) Int. Cl.
*G09G 3/3225* (2016.01)
*H01L 51/52* (2006.01)
*H01L 27/32* (2006.01)

(52) U.S. Cl.
CPC ...... *H01L 27/3246* (2013.01); *H01L 27/3262* (2013.01); *H01L 27/3276* (2013.01); *H01L 51/5218* (2013.01); *H01L 51/5234* (2013.01); *H01L 2251/5315* (2013.01); *H01L 2251/5338* (2013.01)

(56) References Cited

U.S. PATENT DOCUMENTS

| | | | |
|---|---|---|---|
| 9,671,886 B2 | 6/2017 | Yoo et al. | |
| 9,671,914 B2 | 6/2017 | Kim et al. | |
| 2011/0134055 A1* | 6/2011 | Jung | G06F 3/044 345/173 |
| 2012/0050229 A1* | 3/2012 | Tenuta | G06F 3/0418 345/178 |
| 2012/0325639 A1* | 12/2012 | Scuderi | G06F 3/044 200/600 |
| 2013/0162565 A1* | 6/2013 | Kim | G06F 3/041 345/173 |
| 2013/0194213 A1* | 8/2013 | Chou | G06F 3/041 345/173 |
| 2013/0300707 A1* | 11/2013 | Hershman | G06F 3/044 345/174 |
| 2013/0328812 A1* | 12/2013 | Kim | G06F 3/044 345/173 |
| 2014/0152580 A1* | 6/2014 | Weaver | G06F 3/041 345/173 |
| 2015/0324044 A1* | 11/2015 | Chen | G06F 3/044 345/174 |
| 2016/0109998 A1* | 4/2016 | Watanabe | G06F 3/0412 349/12 |
| 2016/0179240 A1* | 6/2016 | Chang | G06F 3/0412 345/174 |

FOREIGN PATENT DOCUMENTS

| | | |
|---|---|---|
| KR | 10-2016-0001482 | 1/2016 |
| KR | 10-1621525 | 5/2016 |
| KR | 10-2016-0072336 | 6/2016 |

* cited by examiner

TOUCH SENSOR INCLUDING TOUCH SENSING ELECTRODES AND DISPLAY DEVICE HAVING THE SAME

CROSS-REFERENCE TO RELATED APPLICATION

The present application claims priority to Korean Patent Application No. 10-2016-0153979, filed on Nov. 18, 2016, which is hereby incorporated by reference for all purposes as if fully set forth herein.

BACKGROUND

Field

The invention relates generally to a touch sensor and a display device including the same, and more particularly, to a touch sensor and a display device including the same having improved sensitivity.

Discussion of the Background

Recent display devices have been developed to include an information input function along with an image display function. The information input function of the display devices may be generally implemented by a touch sensor for receiving user input.

The touch sensor may include a plurality of sensing electrodes, a pad unit having a plurality of pads, and sensing lines that electrically connect the sensing electrodes to the pads.

Applicants discovered that regions of the touch sensor having sensing electrodes close to the pad unit and regions having sensing electrodes distant from the pad unit may have different touch sensitivities due to differing line resistances. For example, the sensitivity of a region distant from the pad unit may be lower than that of a region close to the pad unit.

The above information disclosed in this Background section is only for enhancement of understanding of the background of the inventive concepts, and, therefore, it may contain information that does not constitute prior art.

SUMMARY

Touch sensors and display devices constructed according to the principles of the invention are capable of improving the sensitivity and/or uniformity of sensitivity of the touch sensor. For example, touch sensors constructed according to the invention are capable of reducing and/or preventing touch sensitivities from being different depending on the position of the sensing electrodes.

Additional aspects will be set forth in the detailed description which follows, and, in part, will be apparent from the disclosure, or may be learned by practice of the inventive concepts.

According to one aspect of the invention, a touch sensor includes: a touch sensing column having a plurality of first touch sensing electrodes extending in one direction; a touch sensing row having a plurality of second sensing electrodes extending in another direction intersecting the touch sensing column; and connectors connecting adjacent first touch sensing electrodes or adjacent second touch sensing electrodes. At least some of the first touch sensing electrodes or the second touch sensing electrodes include a first region connected to the connectors and having a first line resis-tance, and a second region adjacent the first region and having a second line resistance. The first line resistance is different from the second line resistance.

The first line resistance may be lower than the second line resistance.

The connectors may include bridge patterns, and the first touch sensing electrodes, the second touch sensing electrodes, and the bridge patterns may include a plurality of conductive fine lines extending in directions intersecting each other.

The conductive fine lines may include first conductive fine lines extending in a first direction, and second conductive fine lines extending in a second direction intersecting the first direction.

Widths of the first conductive fine lines and the second conductive fine lines in the first region and the bridge patterns may are larger than widths of the first conductive fine lines and the second conductive fine lines in the second region.

The touch sensor may further include an insulating layer disposed between the first conductive fine lines and the second conductive fine lines. The insulating layer may include contact holes to electrically connect the first conductive fine lines to the second conductive fine lines.

The contact holes may include first contact holes disposed in the first region and the bridge patterns and second contact holes disposed in the second region. At least some of the areas of the contact holes may be larger than at least some of the areas of the second contact holes.

In regions in which the first conductive fine lines and the second conductive fine lines intersect each other, the first conductive fine lines may include extension areas having a width greater than that of the first conductive fine lines.

The touch sensor may further include a cover layer disposed on the second conductive fine lines.

The first region may have a shape extending substantially across the first touch sensing electrodes or the second touch sensing electrodes.

According to another aspect of the invention, a display device includes: a display panel having a plurality of pixels each including a thin film transistor and a display element; and a touch sensor disposed on the display panel. The touch sensor includes: a touch sensing column having a plurality of first touch sensing electrodes extending in one direction; a touch sensing row having a plurality of second sensing electrodes extending in another direction intersecting the touch sensing column; and connectors connecting at least some of adjacent first touch sensing electrodes or adjacent second touch sensing electrodes. The first touch sensing electrodes or the second touch sensing electrodes include a first region connected to the connectors and having a first line resistance, and a second region adjacent the first region and having a second line resistance, and the first line resistance is smaller that the second line resistance.

At least one display element may be disposed in a region where the first conductive fine lines and the second conductive fine lines intersect.

The display panel may further include: a driving layer disposed on a substrate, the driving layer including the thin film transistor; a display layer disposed on the driving layer, the display layer including the display element; and an encapsulation layer disposed on the display layer, the encapsulation layer protecting the display element. The touch sensor may be disposed on the encapsulation layer.

According to the principles and exemplary embodiments of the invention, the line resistance of the bridge patterns and/or the first region adjacent to the bridge patterns is lower than that of the second region. Thus, the line resistance of the bridge patterns and/or the first region may decrease, thereby improving the uniformity of the sensitivity of the touch sensing electrodes regardless of their position.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
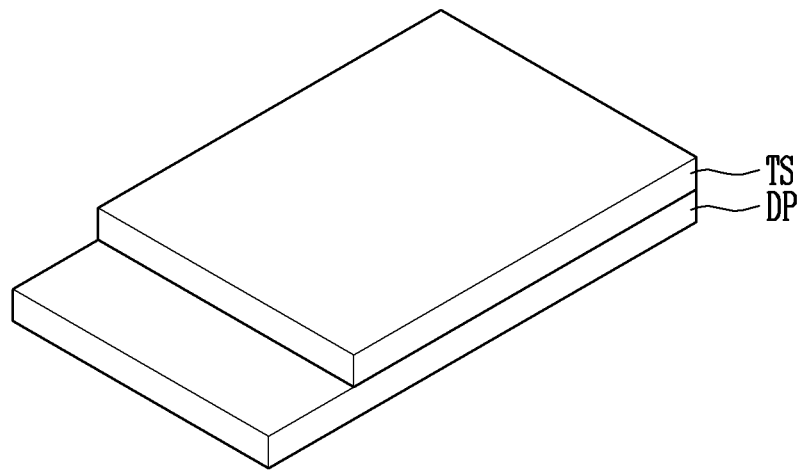
FIG. 1 is a perspective view illustrating an exemplary embodiment of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
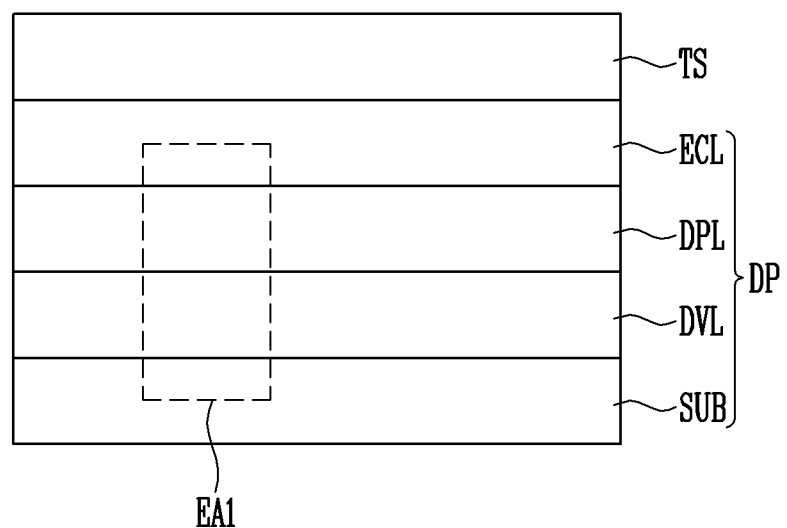
FIG. 2 is a cross-sectional view illustrating the display device of FIG. 1.
Figure 3:
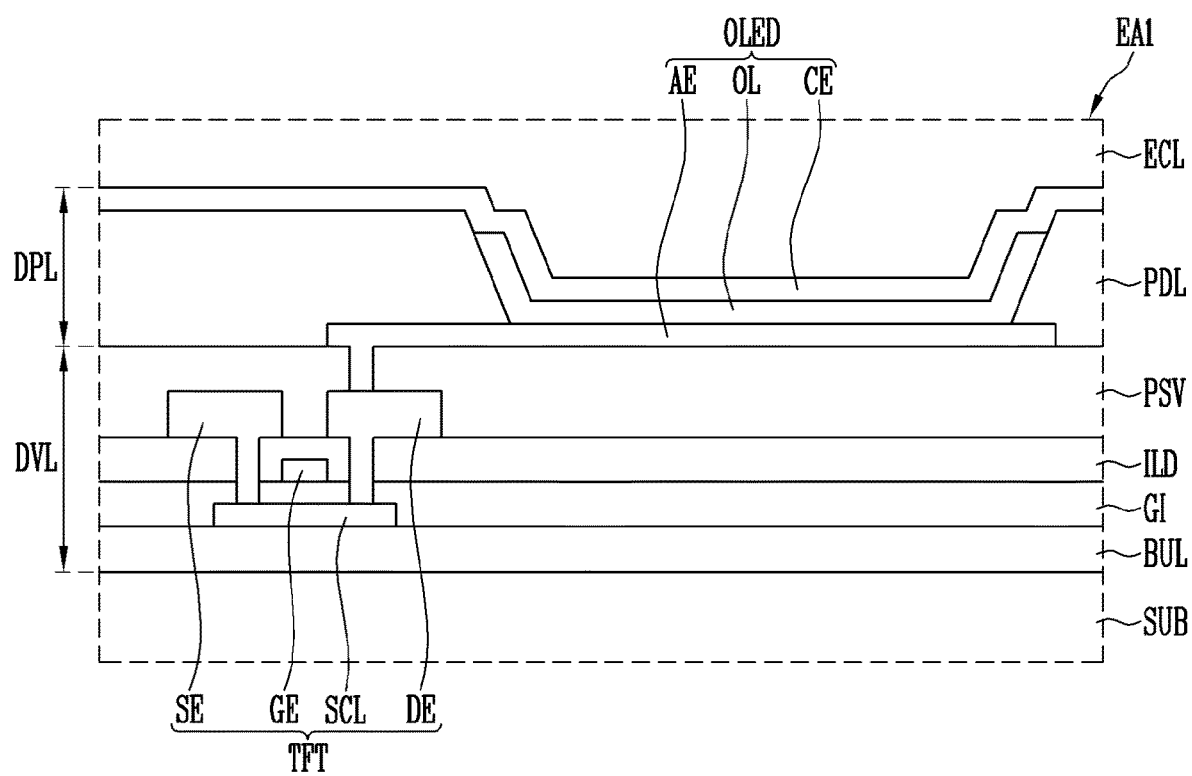
FIG. 3 is an enlarged view of area EA1 of FIG. 2.
Figure 4:
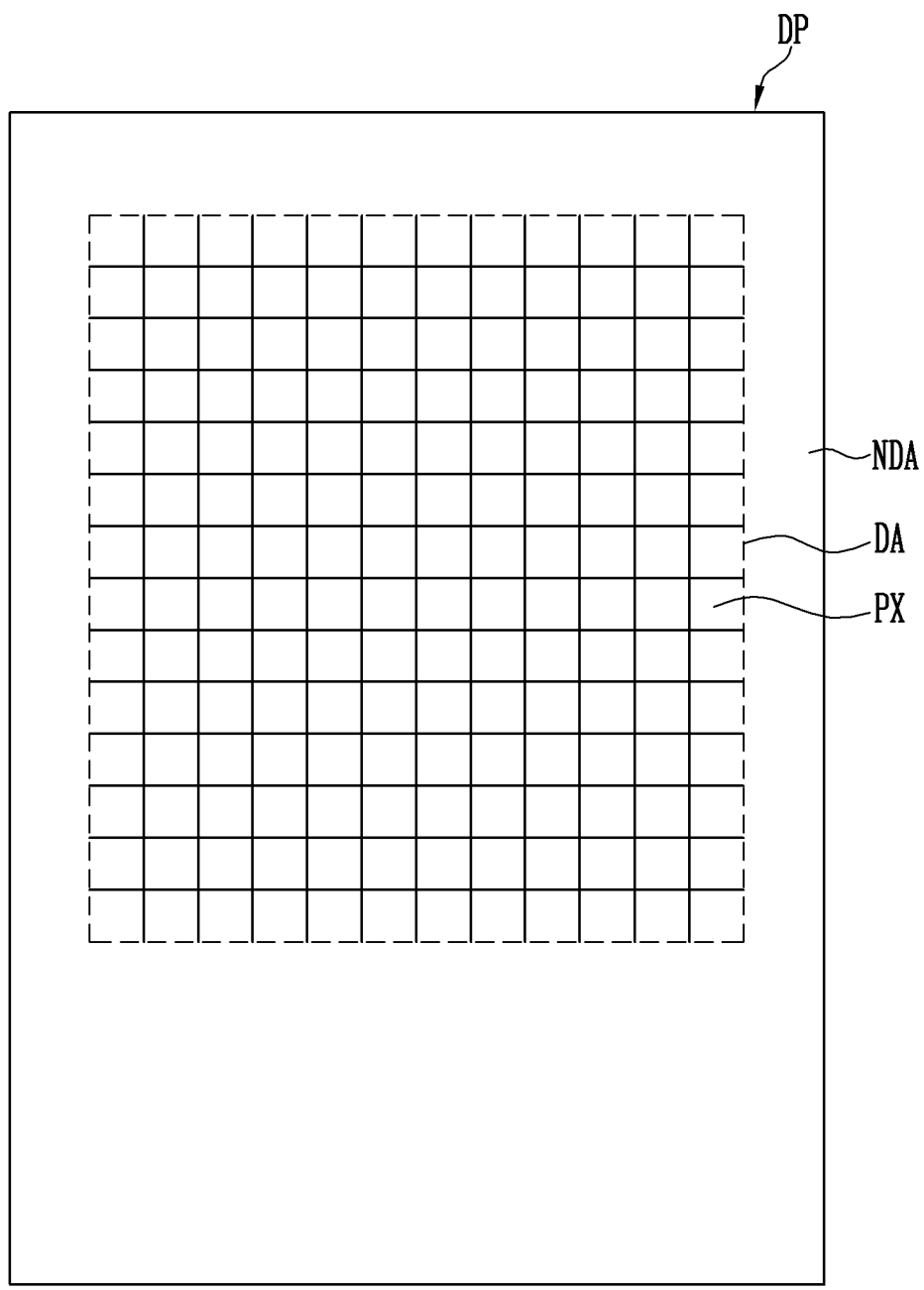
FIG. 4 is a plan view illustrating the display panel of FIG. 1.

FIG. 1 is a perspective view illustrating an exemplary embodiment of a display device constructed according to the principles of the invention. FIG. 2 is a cross-sectional view illustrating the display device of FIG. 1. FIG. 3 is an enlarged view of area EA1 of FIG. 2. FIG. 4 is a plan view illustrating the display panel of FIG. 1.

Referring to FIGS. 1 to 4, the display device may include a display panel DP and a touch sensor TS disposed on the display panel DP.

The display panel DP may include a display area DA and a non-display area NDA.

A plurality of pixels PX may be provided in the display area DA. In addition, a plurality of gate lines and a plurality of data lines intersecting the gate lines may be provided in the display area DA. Each of the pixels PX may include at least one thin film transistor TFT connected to one of the gate lines and one of the data lines, and a display element, connected to and controlled by the thin film transistor TFT.

The display element may be any one of a liquid crystal display element (LCD element), an electrophoretic display element (EPD element), an electrowetting display element (EWD element), and an organic light emitting diode element (OLED element), or other unit is element known in the art to provide light. For convenience of description, the case where the display element is implemented an OLED will be described below as an example.

The non-display area NDA may be disposed adjacent to the display area DA. For example, the non-display area NDA may partially or completely surround the display area DA.

The touch sensor TS may be disposed on the display panel DP. The touch sensor TS may be integrally formed with the display panel DP. Alternatively, the touch sensor TS may be formed separately from the display panel DP and attached to the display panel DP.

Hereinafter, exemplary, stacked structure of the display device will be described sequentially according to a typical order of manufacture.

As shown in FIG. 2, the display panel DP may include a substrate SUB, a driving layer DVL disposed on the substrate SUB, a display layer DPL disposed on the driving layer DVL, and an encapsulation layer ECL disposed on the display layer DPL.

The substrate SUB may include a transparent insulating material to enable light to be transmitted therethrough. The substrate SUB may be a rigid substrate. For example, the substrate SUB may be one of a glass substrate, a quartz substrate, a glass ceramic substrate, and a crystalline glass substrate.

Also, the substrate SUB may be a flexible substrate. Here, the substrate SUB may be one of a film substrate and a plastic substrate, including a polymer organic substance. For example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, exemplary embodiments of the substrate SUB are not limited thereto, and the material forming the substrate SUB may be variously changed. For example, the substrate SUB may be made of fiber glass reinforced plastic (FRP), or the like.

In the pixel PX, the driving layer DVL may include at least one thin film transistor TFT.

As shown in FIG. 3, the thin film transistor TFT may include a semiconductor layer SCL, a gate electrode GE insulated from the semiconductor layer SCL, and source and drain electrodes SE and DE each connected to the semiconductor layer SCL.

The semiconductor layer SCL may be disposed on the substrate SUB. The semiconductor layer SCL may include any one of amorphous silicon (a-Si), polycrystalline silicon (p-Si), oxide semiconductor, and organic semiconductor. Here, the oxide semiconductor may include at least one of Zn, In, Ga, Sn, and any compound thereof. For example, the oxide semiconductor may include indium-gallium-zinc oxide (IGZO).

In the semiconductor layer SCL, regions connected to the source and drain electrodes SE and DE may be source and drain regions doped or injected with impurities. In addition, a region between the source and drain regions may be a channel region.

Meanwhile, when the semiconductor layer SCL includes the oxide semiconductor, a light blocking layer for blocking light introduced into the semiconductor layer SCL may be disposed at the top and bottom of the semiconductor layer SCL.

A buffer layer BUL may be disposed between the substrate SUB and the semiconductor layer SCL. The buffer layer BUL may prevent impurities from being diffused and penetrated into the semiconductor layer SCL from the substrate SUB, thereby preventing or reducing electrical properties of the thin film transistor TFT from being deteriorated.

The buffer layer BUL may include at least one of an organic insulating layer and an inorganic insulating layer. The organic insulating layer may include an organic insulating material that enables light to be transmitted therethrough. For example, the organic insulating layer may include at least one of polyacrylate resin, epoxy resin, phenolic resin, polyamide resin, polyimide resin, unsaturated polyester resin, polyphenylene ether resin, polyphenylene sulfide resin, and benzocyclobutene resin. The inorganic insulating layer may include at least one of silicon oxide (SiOx) and silicon nitride (SiNx). For example, the inorganic insulating layer may include a first layer including silicon oxide, and a second layer disposed on the first layer, the second layer including silicon nitride.

In addition, the buffer layer BUL may prevent moisture and oxygen from being penetrated into the display element OLED from the outside. The buffer layer BUL may planarize a surface of the substrate SUB.

A gate insulating layer GI that covers the semiconductor layer SCL may be disposed on the substrate SUB and the semiconductor layer SCL. The gate insulating layer GI may insulate the semiconductor layer SCL from the gate electrode GE. Like the buffer layer BUL, the gate insulating layer GI may include at least one of an organic insulating layer and an inorganic insulating layer.

The gate electrode GE may be disposed on the gate insulating layer GI. At least a portion of the gate electrode GE may overlap the semiconductor layer SCL. Also, the gate electrode GE may include a conductive material.

An interlayer insulating layer ILD may be disposed on the gate insulating layer GI and the gate electrode GE. The interlayer insulating layer ILD may cover the gate electrode GE. Like the gate insulating layer GI, the interlayer insulating layer ILD may include at least one of an organic insulating layer and an inorganic insulating layer. In addition, portions of the interlayer insulating layer ILD and the gate insulating layer GI may be removed, to expose the source and drain regions of the semiconductor layer SCL therethrough.

The source electrode SE and the drain electrode DE may be disposed on the interlayer insulating layer ILD. The source electrode SE and the drain electrode DE may be insulated from the gate electrode GE by the interlayer insulating layer ILD. Also, the source electrode SE and the drain electrode DE may be connected to the source region and the drain region, respectively.

While the thin film transistor TFT in the illustrated embodiment is shown as having a top gate structure as an example, the structure of the thin film transistor TFT is not limited thereto. For example, the thin film transistor TFT may be a thin film transistor having a bottom gate structure.

The driving layer DVL may further include a protective layer PSV that covers the thin film transistor TFT. The protective layer PSV may expose a portion of the drain electrode DE therethrough.

The protective layer PSV may include at least one layer. For example, the protective layer PSV may include at least one of an inorganic protective layer and an organic protective layer. For example, the protective layer PSV may include an inorganic protective layer that covers the thin film transistor TFT and an organic protective layer disposed on the inorganic protective layer.

The display layer DPL may be disposed on the protective layer PSV. In the pixel PX, the display layer DPL may include a display element OLED connected to the thin film transistor TFT.

The display element OLED may include a first electrode AE connected to the drain electrode DE, an organic layer OL disposed on the first electrode AE, and a second electrode CE disposed on the organic layer OL.

One of the first electrode AE and the second electrode CE may be an anode electrode, and the other of the first electrode AE and the second electrode CE may be a cathode electrode. For example, the first electrode AE may be the anode electrode, and the second electrode CE may be the cathode electrode.

In addition, at least one of the first electrode AE and the second electrode CE may be a transmissive electrode. For example, when the display element OLED is a bottom emission type of OLED element, the first electrode AE may be a transmissive electrode, and the second electrode CE may be a reflective electrode. When the display element OLED is a top emission type of OLED element, the first electrode AE may be a reflective electrode, and the second electrode CE may be a transmissive electrode. When the display element OLED is a double-sided emission type of OLED element, both of the first electrode AE and the second electrode CE may be transmissive electrodes.

When the display element OLED is a top emission type of OLED element, as described herein as an example, the first electrode AE is an anode electrode, and the second electrode CE is the cathode electrode.

The first electrode AE may be disposed on the protective layer PSV. The first electrode AE may include a reflective layer capable of reflecting light and a transparent conductive layer disposed on the top or bottom of the reflective layer. At least one of the reflective layer and the transparent conductive layer may be connected to the drain electrode DE.

The reflective layer may include a material capable of reflecting light. For example, the reflective layer may include at least one of aluminum (Al), silver (Ag), chromium (Cr), molybdenum (Mo), platinum (Pt), nickel (Ni), and any alloy thereof.

The transparent conductive layer may include transparent conductive oxide. For example, the transparent conductive layer may include at least one transparent conductive oxide selected from a group consisting of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

A pixel defining layer PDL may be disposed on the first electrode AE and the protective layer PSV. The pixel defining layer PDL may expose a portion of the first electrode AE therethrough. For example, the pixel defining layer PDL may have a shape covering the protective layer PSV and one or more of the edges of the first electrode AE.

The pixel defining layer PDL may include an organic insulating material. For example, the pixel defining layer PDL may include at least one of polystyrene, polymethylmethacrylate (PMMA), polyacrylonitrile (PAN), polyamide (PA), polyimide (PI), polyarylether (PAE), heterocyclic polymer, parylene, epoxy resin, benzocyclobutene (BCB), siloxane based resin, and silane based resin.

The organic layer OL may have a multi-layered thin film structure including at least one emitting layer (EML). For example, the organic layer OL may include a hole injection layer (HIL) for injecting holes, a hole transport layer (HTL) having a suitable hole transporting property, the HTL for increasing the opportunity for holes and electrons to be re-combined by suppressing the movement of electrons that fail to be combined in the EML, the EML for emitting light through the re-combination of the injected electrons and holes, a hole blocking layer (HBL) for suppressing the movement of holes that fail to be combined in the EML, an electron transport layer (ETL) smoothly transporting electrons to the EML, and an electron transport layer (EIL) for injecting electrons. Here, the HIL, the HTL, the ETL, and the EIL may be common layers that extend to adjacent pixels PX, to be shared by all of the pixels PX. Meanwhile, the color of light generated in the EML may be one of various colors, such as red, green, blue, and white, but the exemplary embodiments are not limited thereto. For example, the color of light generated from the EML of the organic layer OL may also be one of magenta, cyan, and yellow.

The second electrode CE may be disposed on the organic layer OL. The second electrode CE may be a semi-transmissive reflective layer. For example, the second electrode CE may be a thin metal layer having a thickness enabling light to be transmitted therethrough. The second electrode CE may transmit some portion of the light emitted from the organic layer OL, and reflect the other portions of the light emitted from the organic layer OL. The light reflected by the second electrode CE may be reflected by the reflective layer of the first electrode AE and may be transmitted through the second electrode CE by constructive interference.

The second electrode CE may include a material having a lower work function than the transparent conductive layer of the first electrode AE. For example, the second electrode CE may be include at least one of molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and any alloy thereof.

The encapsulation layer ECL may be disposed on the second electrode CE. The encapsulation layer ECL may isolate the display element OLED from an external environment. For example, the encapsulation layer ECL may prevent external moisture and oxygen from being penetrated into the display element OLED. The encapsulation layer ECL may be a thin film encapsulation layer including a plurality of inorganic layers and a plurality of organic layers, which are disposed on the second electrode CE. For example, the encapsulation layer ECL may have a structure in which the inorganic layers and the organic layers are alternately stacked.

While the encapsulation layer ECL isolating the display element OLED from an external environment is described in the illustrated embodiment as an example, exemplary embodiments are not limited thereto. For example, in order to isolate the display element OLED from the external environment, an encapsulation substrate may be used instead of the encapsulation layer ECL. The encapsulation substrate may be joined together with the substrate SUB through a sealant. When the display element OLED is isolated from the external environment by using the encapsulation substrate, the encapsulation layer ECL may be omitted.

The touch sensor TS may be disposed on the encapsulation layer ECL. Also, the touch sensor TS may include a plurality of touch sensing electrodes disposed over some or substantially all of the surface of the touch sensor TS to sense a touch input of a user.

Figure 5:
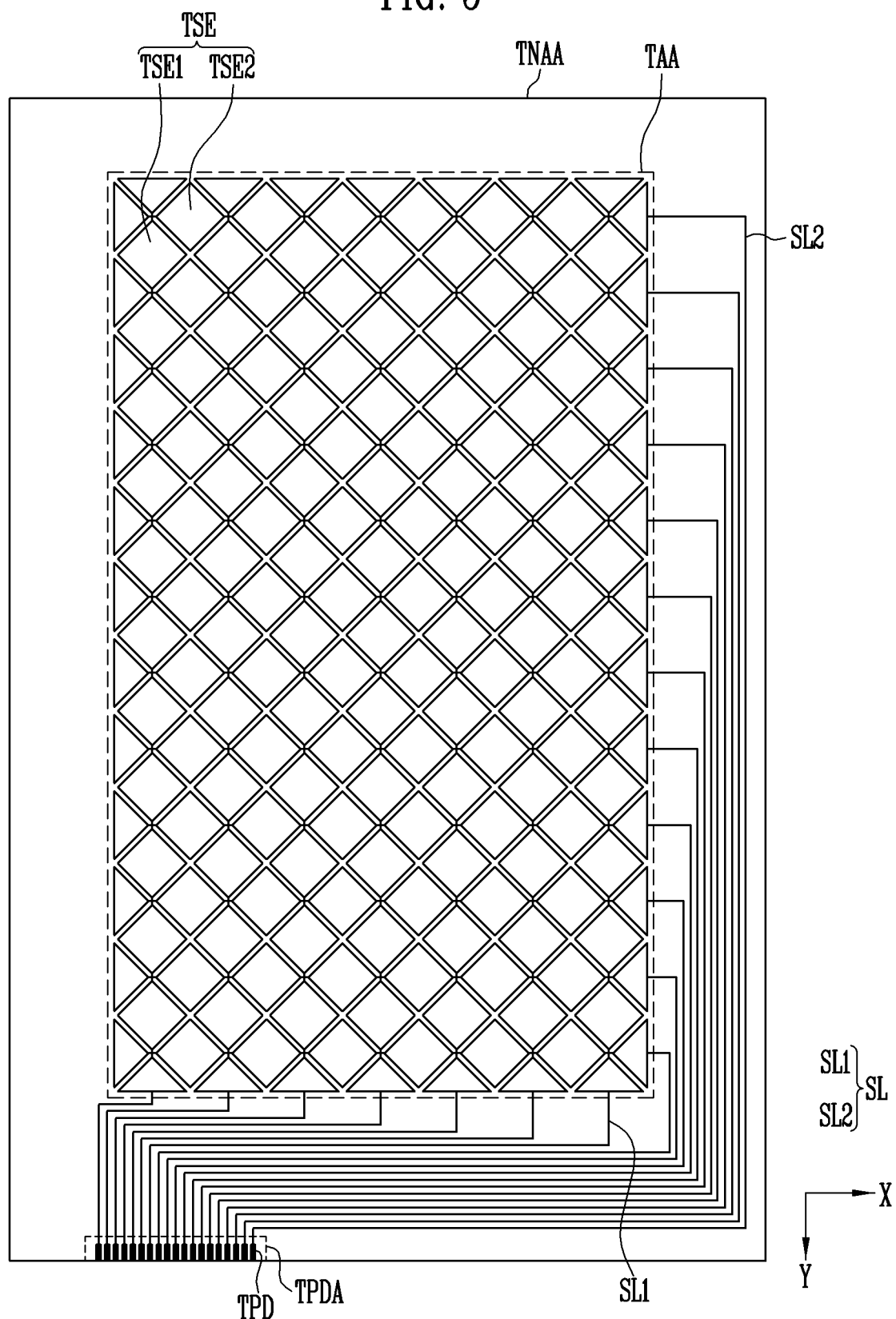
FIGS. 5 and 6 are plan views illustrating exemplary embodiments of a touch sensor of FIG. 1.
Figure 6:
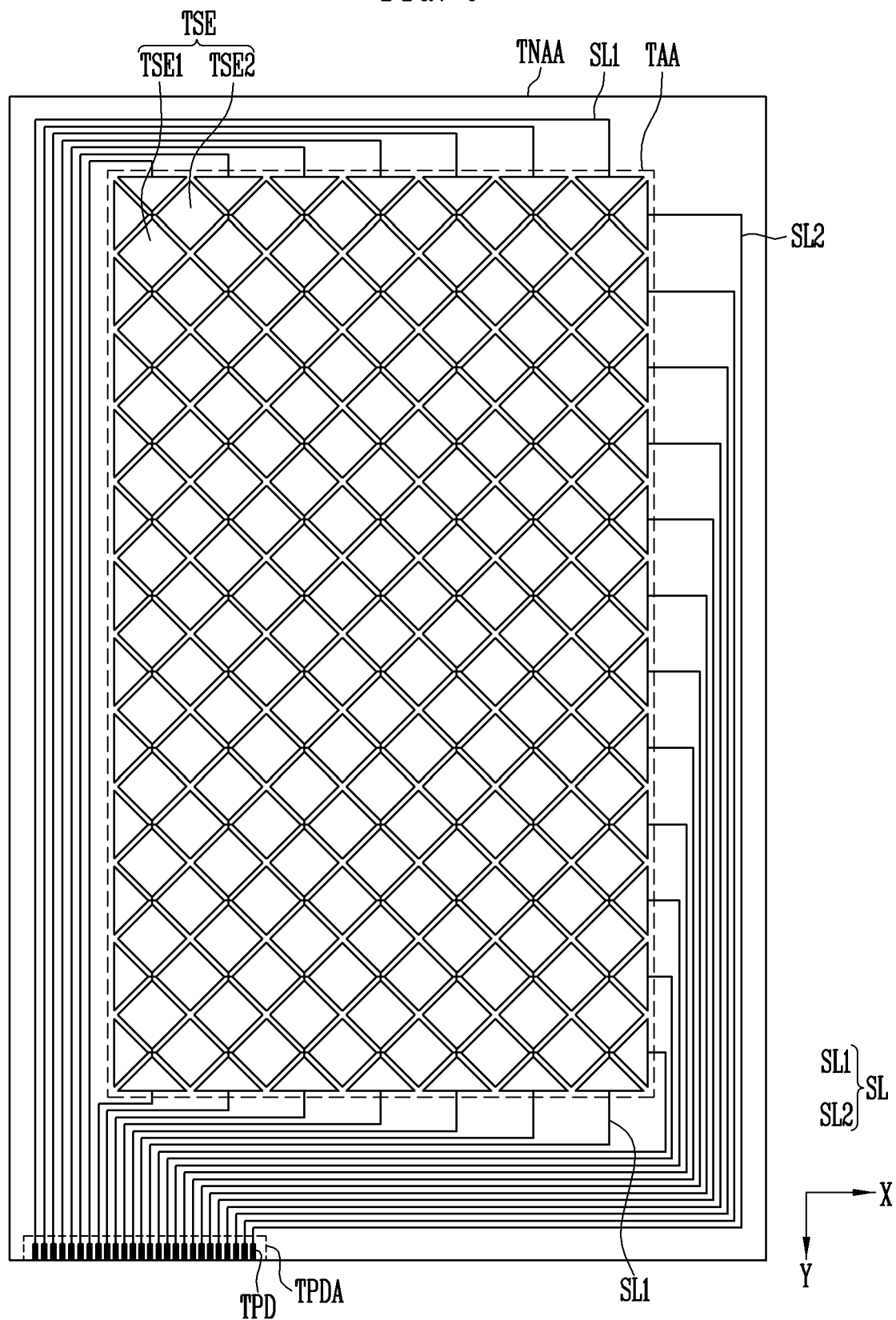

FIGS. 5 and 6 are plan views illustrating exemplary embodiments of a touch sensor of FIG. 1.

Referring to FIGS. 1 to 6, the touch sensor TS may be disposed on the display panel DP. Also, the touch sensor TS may include a touch active area TAA and a touch non-active area TNAA. The touch active area TAA may correspond to the display area DA of the display panel DP. The touch non-active area TNAA may be disposed adjacent to the touch active area TAA. Also, the touch non-active area TNAA may correspond to the non-display area NDA of the display panel DP.

The touch sensor TS may include a plurality of touch sensing electrodes TSE, a touch pad area TPDA including a plurality of touch pads TPD, and sensing lines SL that connect the touch sensing electrodes TSE to the touch pads TPD.

The touch sensing electrodes TSE may be arranged throughout the touch active area TAA in a substantially uniform or a non-uniform manner. The touch sensing electrodes TSE may include first touch sensing electrodes TSE1 and second touch sensing electrodes TSE2. The first touch sensing electrodes TSE1 may be connected to each other along one direction, such as the Y-axis direction, and constitute a plurality of touch sensing columns substantially parallel to each other. In addition, the second touch sensing electrodes TSE2 may be connected to each other in another direction, such as the X-axis direction, intersecting the touch sensing columns, and constitute a plurality of touch sensing rows parallel to each other.

While the illustrated embodiments show the first touch sensing electrodes TSE1 constituting the touch sensing columns and the second touch sensing electrodes TSE2 constituting the touch sensing rows as an example, the exemplary embodiments of the first touch sensing electrodes TSE1 and the second touch sensing electrodes TSE2 are not limited thereto. For example, the first touch sensing electrodes TSE1 may constitute the touch sensing rows, and the second touch sensing electrodes TSE2 may constitute the touch sensing columns, and/or the touch sensing electrodes may be arranged in a different configuration or matrix to cover all or substantially all of the touch active area TAA in a substantially uniform or non-uniform manner.

The touch pad area TPDA and the sensing lines SL may be provided in the touch non-active area TNAA.

The sensing lines SL may connect the touch sensing rows and the touch sensing columns to the touch pads TPD of the touch pad area TPDA. The sensing lines SL may include first sensing lines SL1 and the second sensing lines SL2. The first sensing lines SL1 may connect one of the touch sensing rows and the touch sensing columns, e.g., the touch sensing columns to the touch pads TPD. The second sensing lines SL2 may connect the other of the touch sensing rows and the touch sensing columns, e.g., the touch sensing rows to the touch pads TPD.

The manner of connecting the touch sensing electrodes TSE to the touch pads TPD through the sensing lines SL may be determined according to the driving method of the touch sensor TS. The driving method of the touch sensor TS may be a single routing or a double routing method.

For example, as shown in FIG. 5, the driving method of the touch sensor TS may be the single routing method. Here, the first sensing lines SL1 may connect the touch sensing columns to some of the touch pads TPD, respectively. In addition, the second sensing lines SL2 may connect the touch sensing rows to the others of the touch pads TPD, respectively.

For another example, as shown in FIG. 6, the driving method of the touch sensor TS may be the double routing method. Here, the first sensing lines SL1 may connect both ends of the each touch sensing column to some of the touch pads TPD, respectively. In addition, the second sensing lines SL2 may connect one end of the each touch sensing row to others of the touch pads TPD, respectively.

Although FIG. 6 shows that the first sensing lines SL1 connect both ends of the each touch sensing column to the touch pads TPD and second sensing lines SL2 connect one end of each touch sensing row to the touch pads TPD, exemplary embodiments of the touch sensor TS are not limited thereto. For example, the first sensing lines SL1 may connect one end of each touch sensing column to the touch pads TPD, and the second sensing lines SL2 may connect both ends of the each touch sensing row to the touch pads TPD. For another example, the first sensing lines SL1 may connect both ends of the each touch sensing column to the touch pads TPD, and the second sensing lines SL2 may connect both ends of the each touch sensing row to the touch pads TPD as well.

Figure 7:
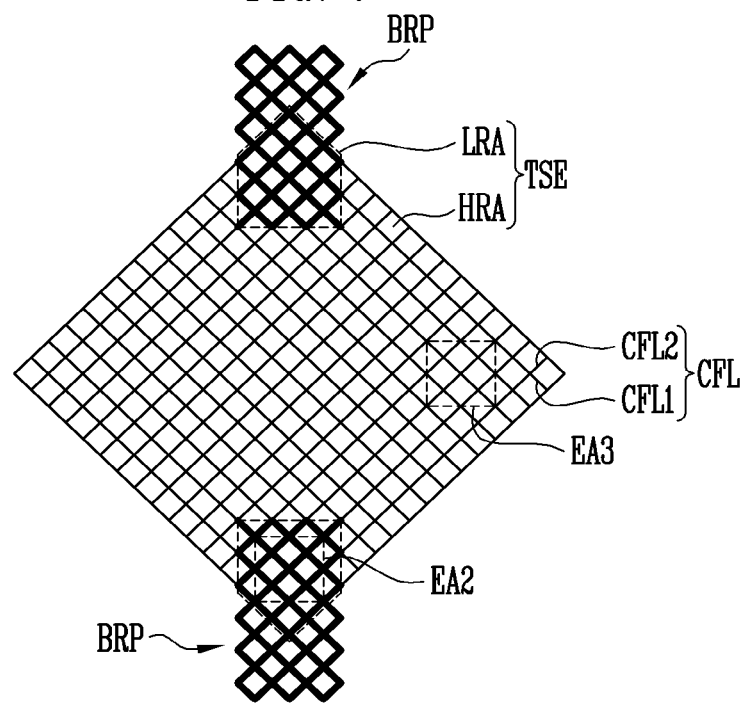
FIG. 7 is a plan view illustrating an exemplary embodiment of a touch sensing electrode and bridge patterns connected to the touch sensing electrode.
Figure 8:
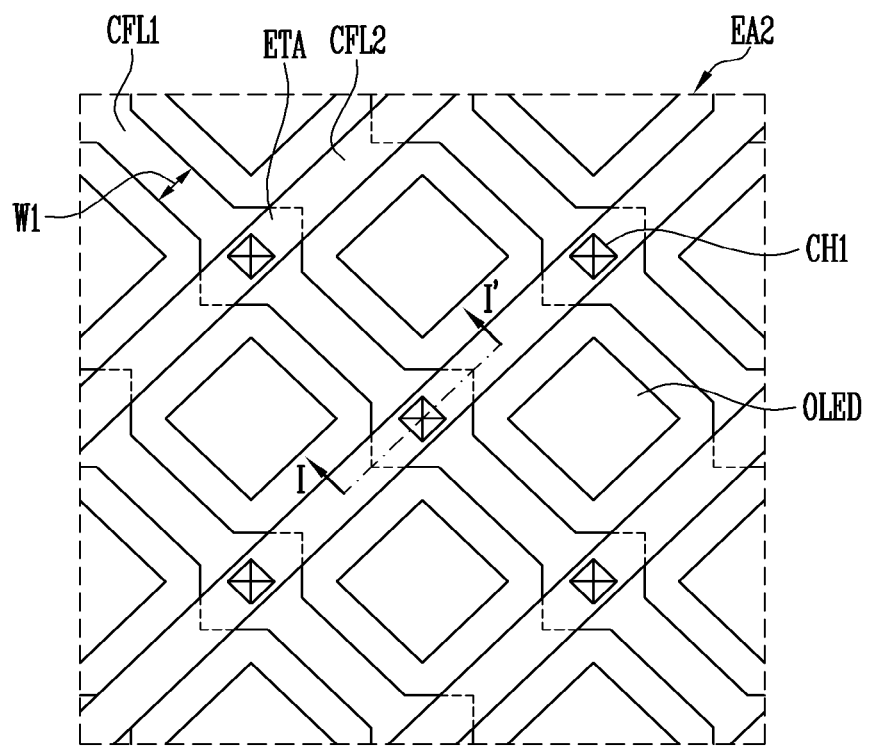
FIG. 8 is an enlarged view of area EA2 of FIG. 7.
Figure 9:
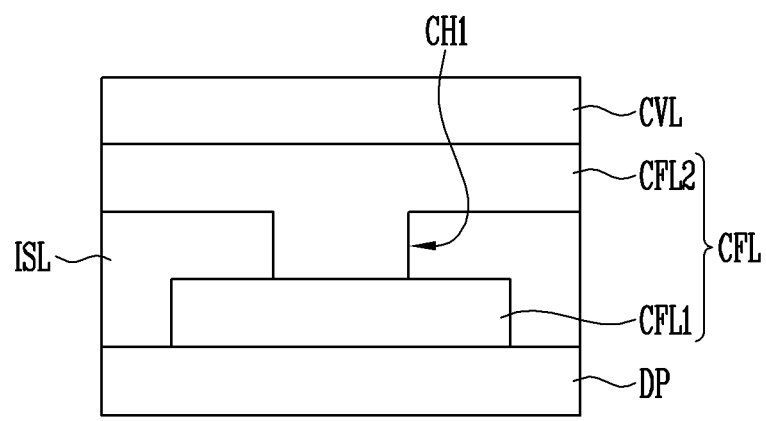
FIG. 9 is a cross-sectional view taken along line I-I' of FIG. 8.
Figure 10:
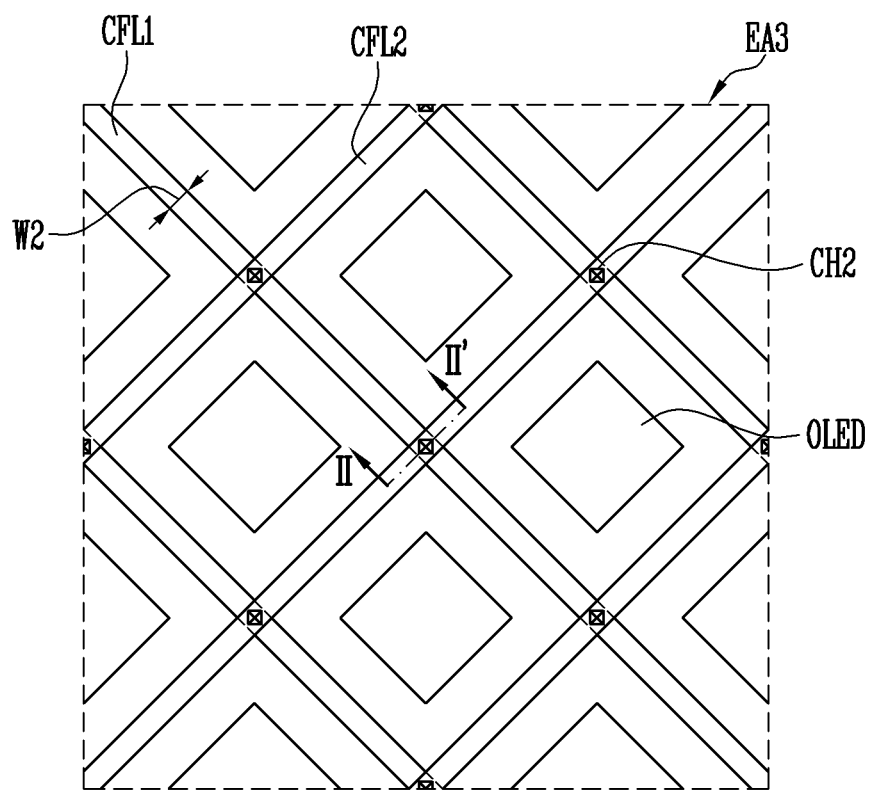
FIG. 10 is an enlarged view of area EA3 of FIG. 7.
Figure 11:
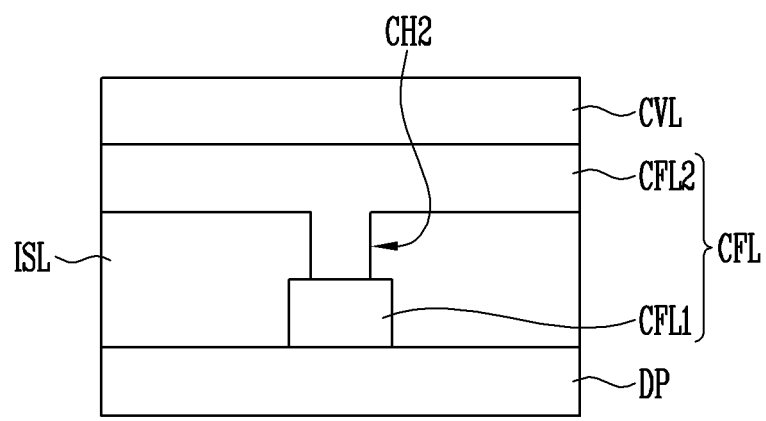
FIG. 11 is a cross-sectional view taken along line II-II' of FIG. 10.

FIG. 7 is a plan view illustrating an exemplary embodiment of a touch sensing electrode and bridge patterns connected to the touch sensing electrode. FIG. 8 is an enlarged view of area EA2 of FIG. 7. FIG. 9 is a cross-sectional view taken along line I-I' of FIG. 8. FIG. 10 is an enlarged view of area EA3 of FIG. 7. FIG. 11 is a cross-sectional view taken along line II-II' of FIG. 10.

Referring to FIGS. 7 to 11, adjacent touch sensing electrodes TSE in the same touch sensing row or the same touch sensing column may be electrically connected to each other through bridge patterns BRP. For example, both ends of each touch sensing electrode TSE may be connected to the bridge patterns BRP, respectively.

The touch sensing electrodes TSE and the bridge patterns BRP may include a plurality of conductive fine lines CFL. For example, the touch sensing electrodes TSE and the bridge patterns BRP may include a plurality of first conductive fine lines CFL1 that extend in one direction and are substantially parallel to each other, and a plurality of second conductive fine lines CFL2 that extend in another direction intersecting the first conductive fine lines CFL1 and are substantially parallel to each other. Thus, the touch sensing electrodes TSE and the bridge patterns BRP may have a mesh structure formed by the conductive fine lines CFL. The mesh structure may be advantageous in implementing a bendable, foldable, or rollable touch sensor.

At least one display element OLED may be disposed in a region where the first conductive fine lines CFL1 and the second conductive fine lines CFL2 intersect. For example, a single display element OLED may be disposed in the region where the first conductive fine lines CFL1 and the second conductive fine lines CFL2 intersect.

The first conductive fine lines CFL1 and the second conductive fine lines CFL2 may include a low-resistance metal. For example, the first conductive fine lines CFL1 and the second conductive fine lines CFL2 may include at least one of gold (Au), silver (Ag), copper (Cu), molybdenum (Mo), aluminum (Al), palladium (Pd), neodymium (Nd), and a silver-palladium-copper alloy (APC).

The first conductive fine lines CFL1 and the second conductive fine lines CFL2 may be disposed in different layers. For example, the first conductive fine lines CFL1 may be disposed on the encapsulation layer (see "ECL" of FIGS. 2 and 3), and the second conductive fine lines CFL2 may be disposed on an insulating layer ISL. The insulating layer ILS may be disposed between the first conductive fine lines CFL1 and the second conductive fine lines CFL2. The first conductive fine lines CFL1 and the second conductive fine lines CFL2 may be electrically connected to each other through contact holes CH1 and CH2 formed in the insulating layer ISL. The insulating layer ISL may include at least one of an organic insulating layer and an inorganic insulating layer.

A cover layer CVL may be provided on the second conductive fine lines CFL2. The cover layer CVL may protect the second conductive fine lines CFL2. The cover layer CVL may include at least one of an organic insulating layer and an inorganic insulating layer. For example, the cover layer CVL may include the same material as the insulating layer ISL.

The touch sensing electrodes TSE may include a first region LRA and a second region HRA adjacent the first region. The first region LRA may be connected to the bridge patterns BRP. For example, the bridge patterns BRP may extend to edge portions of the touch sensing electrodes TSE, and the first region LRA may be a region contacting the bridge patterns BRP at the edge portions of the touch sensing electrodes TSE. As another example, the bridge patterns BRP may extend into portions of the touch sensing electrodes TSE, and the first region LRA may overlap the bridge patterns BRP. The second region HRA may be a region adjacent the first region LRA and may be connected to the bridge patterns BRP through the first region LRA. The line resistance of the first region LRA may be less than that of the second region HRA.

The resistances of the first conductive fine lines CFL1 and the second conductive fine lines CFL2 in the first region LRA and the bridge patterns BRP may be less than those of the first conductive fine lines CFL1 and the second conductive fine lines CFL2 in the second region HRA.

The first conductive fine lines CFL1 and the second conductive fine lines CFL2 in the first region LRA and the bridge patterns BRP may have first widths W1 that are larger than second widths W2 of the first conductive fine lines CFL1 and the second conductive fine lines CFL2 in the second region HRA, thereby resulting in LRA having a lower line resistance than HRA.

Another way to adjust the line resistance in different regions is to control the area of the contact holes in each region. For example the areas of first contact holes CH1 for electrically connecting the first conductive fine lines CFL1 and the second conductive fine lines CFL2 in the first region LRA and the bridge patterns BRP may be larger than those of second contact holes CH2 for electrically connecting the first conductive fine lines CFL1 and the second conductive fine lines CFL2 in the second region HRA, again resulting in LRA having a lower line resistance than HRA.

Yet another way to adjust the line resistance in different regions is to control the widths of extensions areas in the conductive fine lines. For example, in the first region LRA and the bridge patterns BRP, one of the first conductive fine lines CFL1 and the second conductive fine lines CFL2 may include extension areas ETA disposed in regions corresponding to the first contact holes CH1. That is, the extension areas ETA may be disposed in regions in which the first conductive fine lines CFL1 and the second conductive fine lines CFL2 intersect. For example, in the first region LRA and the bridge patterns BRP, the first conductive fine lines CFL1 may include the extension areas ETA in regions intersecting the second conductive fine lines CFL2 as shown in FIG. 8. In this case, each of the extension areas ETA may have a shape extending in the width direction of the first conductive fine lines CFL1. The extension areas ETA may be larger than areas of the first contact holes CH1. Therefore, in the first region LRA and the bridge patterns BRP, portions of the first conductive fine lines CFL1 corresponding to the extension areas ETA may have larger widths than the other portions of the first conductive fine lines CFL1.

The area of the bridge patterns BRP may be smaller than the area of the touch sensing electrodes TSE (See FIGS. 5 and 6). For this reason, the resistance of the bridge patterns BRP may be higher than that of the touch sensing electrodes TSE. It is noted that the touch sensing electrodes TSE are connected each other through the bridge patterns BRP in the touch active area TAA. As such, relatively high resistance of the bridge patterns BRP may cause the touch sensing electrodes TSE to have different sensitivities depending on their positions such as distances from the touch pads TPD.

According to the principles of the invention, the line resistance of the bridge patterns BRP and the first region LRA adjacent to the bridge patterns BRP is lower than that of the second region HRA. Accordingly, the resistance of the bridge patterns BRP and the first region LRA may decrease, thereby eliminating or at least reducing the difference in sensitivity between touch sensing electrodes TSE connected through the bridge patterns BRP.

Given that line resistance is inversely proportional to the sectional area of lines, the conductive fine lines CFL disposed in the bridge patterns BRP and the first region LRA may be formed to have the sectional area greater than the conductive fine lines CFL disposed in the second region HRA. For example, the first widths W1 of the first conductive fine lines CFL1 and the second conductive fine lines CFL2 in the first region LRA and the bridge patterns BRP may be larger than the second widths W2 of the first conductive fine lines CFL1 and the second conductive fine lines CFL2 in the second region HRA. For another example, the areas of the first contact holes CH1 disposed in the first region LRA and the bridge patterns BRP may be larger than those of the second contact holes CH2 disposed in the second region HRA. For still another example, one of the first conductive fine lines CFL1 and the second conductive fine lines CFL2 may include extension areas ETA in the first region LRA and the bridge patterns BRP.

Figure 12:
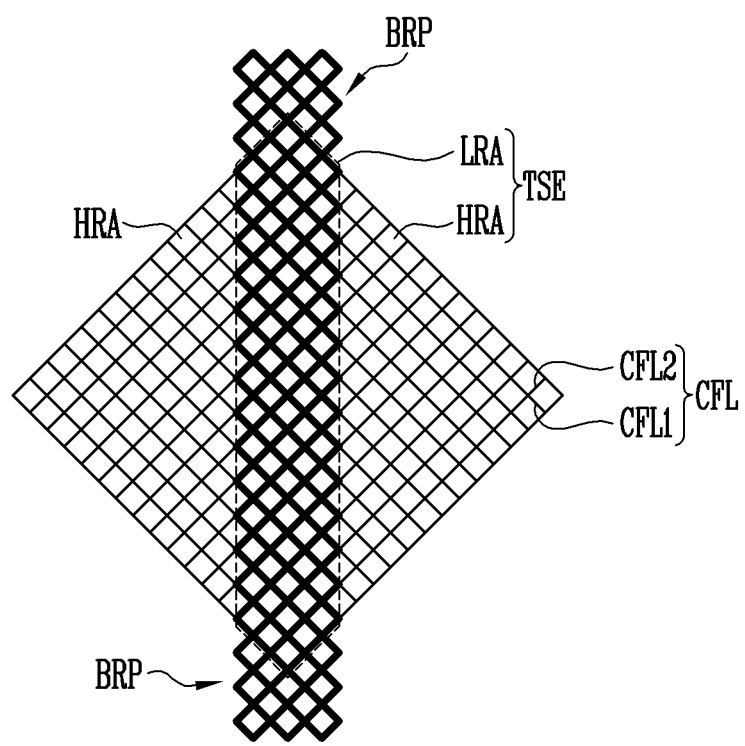
FIG. 12 is a plan view illustrating another exemplary embodiment of a touch sensing electrode and bridge patterns.

FIG. 12 is a plan view illustrating another exemplary embodiment of a touch sensing electrode and bridge patterns.

Referring to FIG. 12, adjacent touch sensing electrodes TSE in the same touch sensing column or the same touch sensing row may be electrically connected to each other through bridge patterns BRP. Both end of each touch sensing electrode TSE may be connected to the bridge patterns BRP, respectively.

The touch sensing electrodes TSE and the bridge patterns BRP may include a plurality of conductive fine lines CFL. For example, the touch sensing electrodes TSE may include a plurality of first conductive fine lines CFL1 that extend in one direction and are substantially parallel to each other, and a plurality of second conductive fine lines CFL2 that extend in another direction intersecting the first conductive fine lines CFL1 and are substantially parallel to each other.

The touch sensing electrodes TSE may include a first region LRA and a second region HRA. The first region LRA may be connected to the bridge patterns BRP. Also, the first region LRA may have a shape extending from one end to the other end of the touch sensing electrode TSE. For example, the first region LRA may have a shape that is parallel to the bridge patterns BRP and crosses the touch sensing electrode TSE.

The second region HRA may be an area adjacent the first region LRA extending across the width of the touch sensing electrode TSE. Since the first region LRA crosses the touch sensing electrode TSE, the second region HRA may be provided at both sides of the first region LRA in the touch sensing electrode TSE.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A touch sensor comprising:
   a touch sensing column having a plurality of first touch sensing electrodes arranged in one direction;
   a touch sensing row having a plurality of second touch sensing electrodes arranged in another direction intersecting the touch sensing column; and
   connectors disposed adjacent to the first touch sensing electrodes to electrically connect the first touch sensing electrodes to each other or disposed adjacent to the second touch sensing electrodes to electrically connect the second touch sensing electrodes to each other,
   wherein:
   at least some of the first touch sensing electrodes or the second touch sensing electrodes include a first region connected to the connectors and having a first line resistance, and a second region adjacent to the first region and having a second line resistance, with the first line resistance being different from the second line resistance,
   the first touch sensing electrodes, the second touch sensing electrodes, and the connectors include a plurality of intersecting conductive fine lines including first conductive fine lines extending in a first direction and second conductive fine lines extending in a second direction intersecting the first direction, and
   widths of the first conductive fine lines and the second conductive fine lines in the first region and the connectors are lamer than widths of the first conductive fine lines and the second conductive fine lines in the second region.

2. The touch sensor of claim 1, wherein the first line resistance is lower than the second line resistance.

3. The touch sensor of claim 1, wherein the connectors comprise bridge patterns connecting adjacent first touch sensing electrodes or adjacent second touch sensing electrodes.

4. The touch sensor of claim 1, further comprising an insulating layer disposed between the first conductive fine lines and the second conductive fine lines,
   wherein the insulating layer comprises contact holes to electrically connect the first conductive fine lines to the second conductive fine lines.

5. The touch sensor of claim 4, wherein:
   the contact holes comprise first contact holes disposed in the first region and the connectors and second contact holes disposed in the second region; and
   at least some of the areas of the first contact holes are larger than at least some of the areas of the second contact holes.

6. The touch sensor of claim 1, wherein, in regions in which the first conductive fine lines and the second conductive fine lines intersect each other, the first conductive fine lines comprise extension areas having a width greater than that of the first conductive fine lines.

7. The touch sensor of claim 4, further comprising a cover layer disposed on the second conductive fine lines.

8. The touch sensor of claim 1, wherein the first region has a shape extending substantially across the first touch sensing electrodes or the second touch sensing electrodes.

9. A display device comprising:
   a display panel having a plurality of pixels, each including a thin film transistor and a display element; and
   the touch sensor of claim 1.

10. A touch sensor comprising:
    a touch sensing column having a plurality of first touch sensing electrodes arranged in one direction;
    a touch sensing row having a plurality of second touch sensing electrodes arranged in another direction intersecting the touch sensing column; and
    bridge patterns connecting adjacent first touch sensing electrodes or adjacent second touch sensing electrodes,
    wherein:
    at least some of the first touch sensing electrodes or the second touch sensing electrodes include a first region connected to the bridge patterns and having a first line resistance, and a second region adjacent to the first region and having a second line resistance, the first line resistance being different from the second line resistance;
    the first touch sensing electrodes, the second touch sensing electrodes, and the bridge patterns include a plurality of conductive fine lines extending in directions intersecting each other; and
    widths of the conductive fine lines in the first region and the bridge patterns are larger than widths of the conductive fine lines in the second region.

11. The touch sensor of claim 10, wherein the first line resistance is lower than the second line resistance.

12. The touch sensor of claim 10, wherein the conductive fine lines comprises:
    first conductive fine lines extending in a first direction; and
    second conductive fine lines extending in a second direction intersecting the first direction.

13. A touch sensor comprising:
a touch sensing column having a plurality of first touch sensing electrodes arranged in one direction;
a touch sensing row having a plurality of second touch sensing electrodes arranged in another direction intersecting the touch sensing column; and
bridge patterns connecting adjacent first touch sensing electrodes or adjacent second touch sensing electrodes,
wherein:
at least some of the first touch sensing electrodes or the second touch sensing electrodes include a first region connected to the bridge patterns and having a first line resistance, and a second region adjacent to the first region and having a second line resistance, the first line resistance being different from the second line resistance;
the first touch sensing electrodes, the second touch sensing electrodes, and the bridge patterns include first conductive fine lines extending in a first direction and second conductive fine lines extending in a second direction intersecting the first direction, the first conductive fine lines electrically connected to the second conductive fine lines through connect holes;
the contact holes comprise first contact holes disposed in the first region and the bridge patterns and second contact holes disposed in the second region; and
at least some of the areas of the first contact holes are larger than at least some of the areas of the second contact holes.

14. The touch sensor of claim 13, wherein the first line resistance is lower than the second line resistance.

15. The touch sensor of claim 13, further comprising an insulating layer disposed between the first conductive fine lines and the second conductive fine lines,
wherein the contact holes are disposed in the insulating layer.

* * * * *